(12) United States Patent
Jiang et al.

(10) Patent No.: US 9,184,182 B2
(45) Date of Patent: Nov. 10, 2015

(54) ARRAY SUBSTRATE AND DISPLAY PANEL

(71) Applicant: Shenzhen China Star Optoelectronics Technology Co., Ltd., Shenzhen, Guangdong (CN)

(72) Inventors: Jiali Jiang, Shenzhen (CN); Ming-hung Shih, Shenzhen (CN); Peng Du, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 140 days.

(21) Appl. No.: 14/006,100

(22) PCT Filed: Jul. 24, 2013

(86) PCT No.: PCT/CN2013/080019
§ 371 (c)(1),
(2) Date: Sep. 18, 2013

(87) PCT Pub. No.: WO2015/006993
PCT Pub. Date: Jan. 22, 2015

(65) Prior Publication Data
US 2015/0022749 A1 Jan. 22, 2015

(30) Foreign Application Priority Data
Jul. 19, 2013 (CN) .................. 2013 1 03068868

(51) Int. Cl.
G02F 1/1343 (2006.01)
H01L 27/12 (2006.01)
G02F 1/1362 (2006.01)

(52) U.S. Cl.
CPC ........ H01L 27/124 (2013.01); G02F 1/134363 (2013.01); G02F 1/136227 (2013.01)

(58) Field of Classification Search
CPC ...... H01L 27/12; H01L 27/124; G02F 1/1362
USPC .............................. 349/139, 42, 141
See application file for complete search history.

(56) References Cited

U.S. PATENT DOCUMENTS

| | | | |
|---|---|---|---|
| 2002/0001867 A1* | 1/2002 | Sung et al. ...................... 438/30 |
| 2005/0078262 A1* | 4/2005 | Ono et al. ..................... 349/141 |
| 2008/0094559 A1* | 4/2008 | Lee et al. ...................... 349/143 |
| 2010/0002179 A1* | 1/2010 | Horiguchi .................... 349/139 |
| 2010/0296015 A1* | 11/2010 | Kim et al. ....................... 349/37 |
| 2011/0304787 A1* | 12/2011 | Wang et al. .................... 349/33 |
| 2012/0092606 A1* | 4/2012 | Tai et al. ...................... 349/141 |
| 2012/0182490 A1* | 7/2012 | Kim et al. ....................... 349/43 |

* cited by examiner

Primary Examiner — Sang V Nguyen
(74) Attorney, Agent, or Firm — Andrew C. Cheng

(57) ABSTRACT

An array substrate and a display panel are disclosed. The array substrate includes at least one data line, at least one scanning line, and a pixel cell defined by the data line and the scanning line. The pixel cell includes an ITO thin film and at least one metallic layer below the ITO thin film. The ITO thin film electrically connects to the metallic layer via a through hole. The ITO thin film includes a slit arranged between the ITO thin film and the through hole, and the slit is arranged to avoid the disclination lines so as to improve the display performance.

12 Claims, 3 Drawing Sheets

ARRAY SUBSTRATE AND DISPLAY PANEL

BACKGROUND OF THE INVENTION

1. Field of the Invention

The present disclosure relates to liquid crystal display technology, and more particularly to an array substrate and a display panel.

2. Discussion of the Related Art

Liquid crystal display panels include an array substrate, a color filtering substrate opposite to the array substrate, and a liquid crystal layer therebetween. The color filtering substrate includes an ITO thin film. The array substrate includes pixel cells for displaying images. The pixel cell includes the ITO layer for electrically connecting to corresponding metallic layer via a through hole.

The above ITO layers cooperatively generate an electric field. The through hole may result in a lateral electrical field around edges of the through hole. The lateral electrical field drives the liquid crystal at the lateral sides to overlap with the liquid crystal in the central portion to form disclination lines.

The disclination lines may reduce the transmission rate of the display panel so as to increase the cost. When the dimension of the disclination lines is huge, the Mura effect may occur.

SUMMARY

The object of the invention is to provide an array substrate and a display panel to avoid the disclination lines so as to improve the display performance.

In one aspect, an array substrate includes: at least one data line, at least one scanning line, and a pixel cell defined by the data line and the scanning line, the pixel cell comprises an ITO thin film and at least one metallic layer below the ITO thin film, the ITO thin film electrically connects to the metallic layer via a through hole, the ITO thin film comprises a slit arranged between the ITO thin film and the through hole, and the slit is arranged to avoid the disclination lines; a length and a width of the slit are respectively larger than 2.5 microns; and the pixel cell comprises a thin film transistor arranged in an junction of the data line and the scanning line and a passivating layer arranged between the ITO thin film and the metallic layer, the metallic layer comprises a source metallic layer and a drain metallic layer of the thin film transistor, the through hole passes through the passivating layer to expose the source or the drain metallic layer, and the ITO thin film is disposed above the source or drain metallic layer of the thin film transistor by the through hole.

Wherein the slit is arranged corresponding to an edge of the source or drain metallic layer, and the slit extends along a direction farther away from the through hole.

In another aspect, an array substrate includes: at least one data line, at least one scanning line, and a pixel cell defined by the data line and the scanning line, the pixel cell comprises an ITO thin film and at least one metallic layer below the ITO thin film, the ITO thin film electrically connects to the metallic layer via a through hole, the ITO thin film comprises a slit arranged between the ITO thin film and the through hole, and the slit is arranged to avoid the disclination lines.

Wherein a length and a width of the slit are respectively larger than 2.5 microns.

Wherein the pixel cell comprises a thin film transistor arranged in an junction of the data line and the scanning line and a passivating layer arranged between the ITO thin film and the metallic layer, the metallic layer comprises a source metallic layer and a drain metallic layer of the thin film transistor, the through hole passes through the passivating layer to expose the source or the drain metallic layer, and the ITO thin film is disposed above the source or drain metallic layer of the thin film transistor by the through hole.

Wherein the slit is arranged corresponding to an edge of the source or drain metallic layer, and the slit extends along a direction farther away from the through hole.

Wherein the pixel cell further comprises the passivating layer and an insulating layer between the ITO thin film and the metallic layer, the metallic layer comprises a common-electrode metallic layer, the through hole passes through the insulation layer and the passivating layer to expose the common-electrode metallic layer, and the ITO thin film is arranged above the common-electrode metallic layer via the through hole.

Wherein the slit is arranged corresponding to an edge of the common-electrode metallic layer, and the slit extends along the direction farther away from the through hole.

In another aspect, a display panel includes: a color filtering substrate, and an array substrate opposite to the color filtering substrate, the array substrate comprises at least one data line, at least one scanning line, and a pixel cell defined by the data line and the scanning line, the pixel cell comprises an ITO thin film and at least one metallic layer below the ITO thin film, the ITO thin film electrically connects to the metallic layer via a through hole, the ITO thin film comprises a slit arranged between the ITO thin film and the through hole, and the slit is arranged to avoid the disclination lines.

Wherein a length and a width of the slit are respectively larger than 2.5 microns.

Wherein the pixel cell comprises a thin film transistor arranged in an junction of the data line and the scanning line and a passivating layer arranged between the ITO thin film and the metallic layer, the metallic layer comprises a source metallic layer and a drain metallic layer of the thin film transistor, the through hole passes through the passivating layer to expose the source or the drain metallic layer, and the ITO thin film is disposed above the source or dram metallic layer of the thin film transistor by the through hole.

Wherein the slit is arranged corresponding to an edge of the source or drain metallic layer, and the slit extends along a direction farther away from the through hole.

Wherein the pixel cell further comprises the passivating layer and an insulating layer between the ITO thin film and the metallic layer, the metallic layer comprises a common-electrode metallic layer, the through hole passes through the insulation layer and the passivating layer to expose the common-electrode metallic layer, and the ITO thin film is arranged above the common-electrode metallic layer via the through hole.

Wherein the slit is arranged corresponding to an edge of the common-electrode metallic layer, and the slit extends along the direction farther away from the through hole.

DETAILED DESCRIPTION OF THE EMBODIMENTS

Embodiments of the invention will now be described more fully hereinafter with reference to the accompanying drawings, in which embodiments of the invention are shown.

Figure 1:
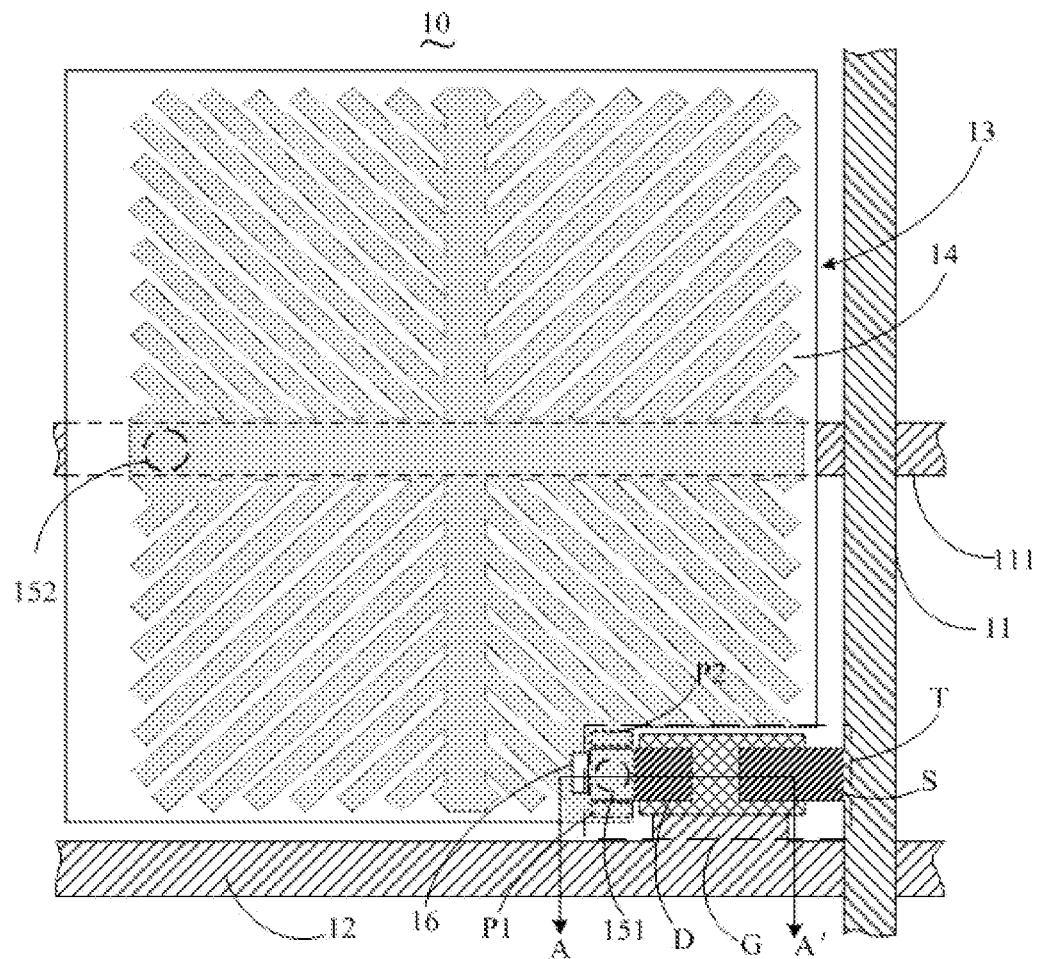
FIG. 1 is a schematic view of the array substrate in accordance with a first embodiment.
Figure 2:
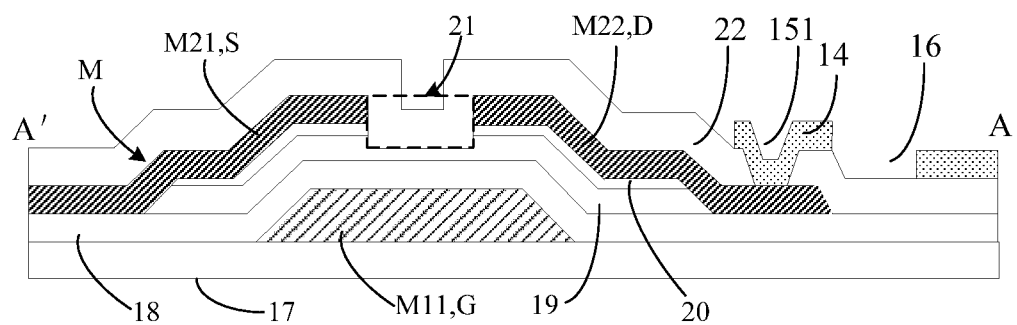
FIG. 2 is a cross section view of the array substrate of FIG. 1 along the A-A' line.

FIG. 1 is a schematic view of the array substrate in accordance with a first embodiment. FIG. 2 is a cross section view of the array substrate of FIG. 1 along the A-A' line. Referring to FIGS. 1 and 2, the array substrate 10 includes at least one data line 11, at least one scanning line 12, and a pixel cell 13 defined by the data line 11 and the scanning line 12. The pixel cell 13 includes an ITO thin film 14 and at least one metallic layer (M) below the ITO thin film 14. The ITO thin film 14 electrically connects to the metallic layer (M) via a through hole 151. The ITO thin film 14 includes a slit 16 arranged between the ITO thin film 14 and the through hole 151. The slit 16 is arranged to avoid the disclination lines.

In one embodiment, the pixel cell 13 includes a transistor (T) and a common electrode 111 arranged in the junction of the data line 11 and the scanning line 12. The transistor (T) includes a gate (G), a source (S) and a drain (D). The gate (G) electrically connects to the scanning line 12, the source (S) electrically connects to the data line 11, and the drain (D) electrically connects to the ITO thin film 14 via the through hole 151. The common electrode 111 is parallel to the scanning line 12, and electrically connects to the ITO thin film 14 via the through hole 151.

In one embodiment, the metallic, layer (M) includes a gate metallic layer (M11), a source metallic layer (M21), and a drain metallic layer (M22). The gate (G) is formed by the gate metallic layer (M11) arranged on a glass substrate 17 of the array substrate 10. A gate insulation layer 18 is formed on the gate (G) for insulating the gate (G), the source (S), and the drain (D). A semiconductor layer 19 and a doped semiconductor layer 20 are formed on the gate insulation layer 18. A slot 21 is arranged on the semiconductor layer 19 and the doped semiconductor layer 20. The slot 21 passes through the doped semiconductor layer 20 and passes a portion of the semiconductor layer 19. The source (S) is formed by the source metallic layer (M21). The drain (D) is formed by the drain metallic layer (M22). The source metallic layer (M21) and the drain metallic layer (M22) are respectively arranged at two lateral sides of the slot 21. In addition, the source metallic layer (M21) and the drain metallic layer (M22) are arranged above the doped semiconductor layer 20. The semiconductor layer 19 and the doped semiconductor layer 20 are configured to function as transistors. Specifically, when the gate (G) receives turn-on signals from the scanning line 12 for turning on the transistor (T), the source (S) and the drain (D) are controlled to be connected by the semiconductor layer 19 and the doped semiconductor layer 20 such that the signals from the data line 11 are transmitted from the source (S) to the drain (D). Before receiving the signals from the scanning line 12 or upon receiving turn-off signals from the scanning line 12 to turn off the transistor (T), the semiconductor layer 19 and the doped semiconductor layer 20 disconnect the source (S) and the drain (D). A passivating layer 22 covers the source metallic layer (M21) and the drain metallic layer (M22). The through hole 151 is arranged on the passivating layer 22 corresponding to the locations of the drain metallic layer (M22). In addition, the through hole 151 passes through the passivating layer 22 such that the drain metallic layer (M22) of the transistor (T) is exposed. The ITO thin film 14 is disposed above the passivating layer 22, and electrically connects to the drain metallic layer (M22) via the through hole 151.

In the embodiment, the slit 16 is arranged corresponding to the edge of the drain metallic layer (M22) of the transistor (T). Preferably, a length and a width of the slit 16 are respectively larger than 2.5 microns (μ). The slit 16 extends along a direction farther away from the through hole 151. For example, the slit 16 is arranged at the location labeled by "P1" or "P2" in FIG. 1. In other embodiments, the slit 16 may be ring-shaped for surrounding the through hole 151. The location and the shape of the slit 16 are not limited to the above disclosure. It is to be noted that even though the slit 16 is arranged between the ITO thin film 14 and the through hole 151, the ITO thin film 14 and the through hole 151 remain connected.

In the embodiment, the source metallic layer (M21) and the drain metallic layer (M22) are made by the same metallic materials.

In other embodiments, the through hole 151 is arranged on the passivating layer 22 corresponding to the locations of the source metallic layer (M21). That is, the ITO thin film 14 electrically connects to the source metallic layer (M21) via the through hole 151. At the moment, the slit 16 is arranged corresponding to the edge of the source metallic layer (M21), and the slit 16 extends along a direction farther away from the through hole 151.

By arranging the slit 16 between the ITO thin film 14 and the through hole 151, corresponding electrical fields are respectively generated at two lateral sides of the slit 16. Thus, the lateral electrical field caused by the through hole 151 is weaken so as to reduce the possibility of the disclination lines.

Figure 3:
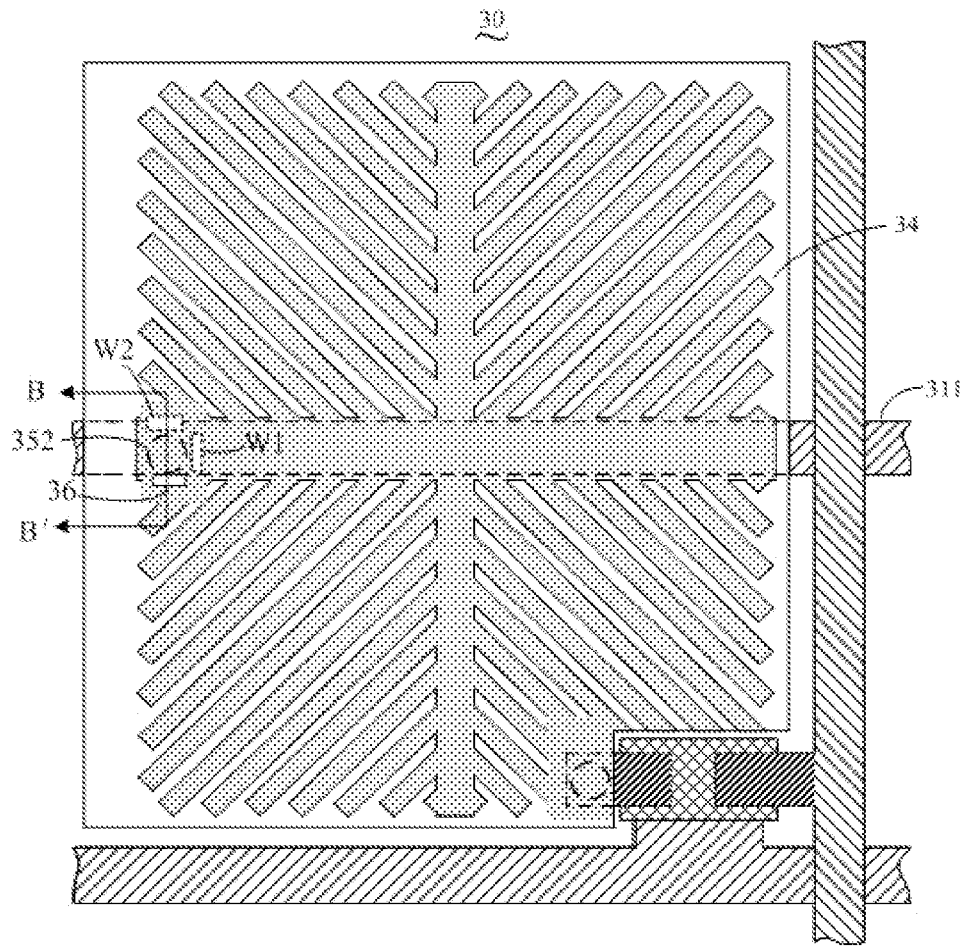
FIG. 3 is a schematic view of the array substrate in accordance with a second embodiment.
Figure 4:
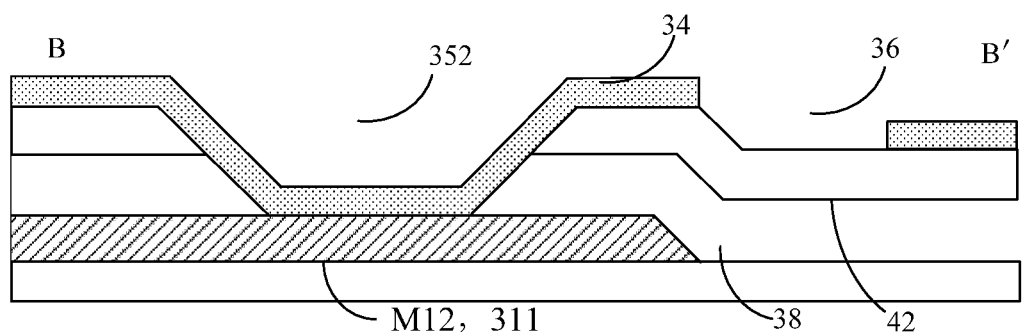
FIG. 4 is a cross section view of the array substrate of FIG. 3 along the B-B' line.

FIG. 3 is a schematic view of the array substrate in accordance with a second embodiment. As shown in FIG. 3, the slit 36 is arranged between the ITO thin film 34 and the through hole 352. FIG. 4 is a cross section view of the array substrate of FIG. 3 along the B-B' line. In the embodiment, the metallic layer includes a common-electrode metallic layer (M12). The common electrode 311 is formed by the common-electrode metallic layer (M12). The common-electrode metallic layer (M12) and the gate metallic layer (M11) are made by the same metallic material. In addition, the common-electrode metallic layer (M12) and the gate metallic layer (M11) are arranged on the same layer. The insulation layer 38 and the passivating layer 42 are arranged above the common-electrode metallic layer (M12) in turn. The through hole 352 passes through the insulation layer 38 and the passivating layer 42, and the common-electrode metallic layer (M12) is exposed. The ITO thin film 34 electrically connects to the common-electrode metallic layer (M12) via the through hole 352. The slit 36 is arranged corresponding to the edge of the common-electrode metallic layer (M12). In addition, the slit 36 extends along the direction farther away from the through hole 352. In other embodiments, the slit 36 may be arranged at the location labeled by "W1" or "W2" as shown. The slit 36 may be ring-shaped for surrounding the through hole 352. The location and the shape of the slit 36 are not limited to the above disclosure. It is to be noted that even though the slit 36 is arranged between the ITO thin film 14 and the through hole 352, the ITO thin film 14 and the through hole 352 remain connected.

Similarly, by arranging the slit 36 between the ITO thin film 14 and the through hole 352, corresponding electrical fields are respectively generated at two lateral sides of the slit 36. Thus, the lateral electrical field caused by the through hole 352 is weaken so as to reduce the possibility of the disclination lines.

Figure 5:
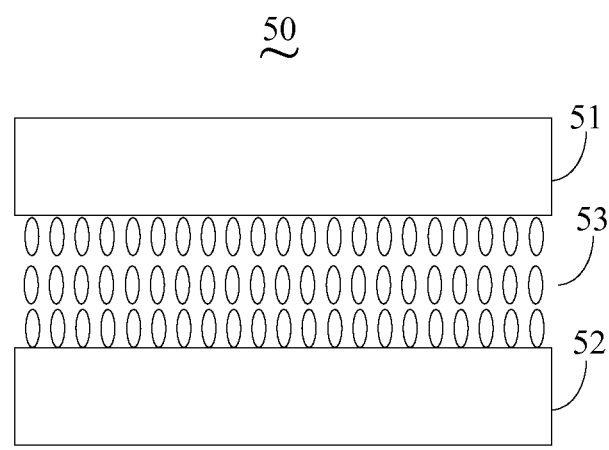
FIG. 5 is a schematic view of the display panel in accordance with one embodiment.

FIG. 5 is a schematic view of the display panel in accordance with one embodiment. The display panel 50 includes a color filtering substrate 51, the above array substrate 52 opposite to the color filtering substrate 51, and a liquid crystal layer 53.

In view of the above, the ITO thin film on the pixel cell electrically connects to the metallic layer via the through hole. By arranging the slit between the ITO thin film and the through hole, corresponding electrical fields are respectively generated at two lateral sides of the slit. Thus, the lateral electrical field caused by the through hole is weaken so as to reduce the possibility of the disclination lines.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate, comprising:
   at least one data line, at least one scanning line, and a pixel cell defined by the data line and the scanning line, the pixel cell comprises an Indium Tin Oxide (ITO) thin film and at least one metallic layer below the ITO thin film, the ITO thin film electrically connects to the metallic layer via a through hole, the metallic layer comprises a gate metallic layer and a common-electrode metallic layer, the ITO thin film comprises a slit arranged between the ITO thin film and the through hole;
   a drain metallic layer; a slot arranged in the semiconductor layer and the doped semiconductor layer; wherein the slot passes through the drain metallic layer, the doped semiconductor, and a portion of the semiconductor layer;
   the pixel cell further comprises a passivating layer and an insulation layer being arranged above the common-electrode metallic layer in turn, and the common-electrode metallic layer and the gate metallic layer are arranged on the same layer; and
   wherein the slit is arranged corresponding to an edge of the common-electrode metallic layer.

2. The array substrate as claimed in claim 1, wherein a length and a width of the slit are respectively larger than 2.5 microns.

3. The array substrate as claimed in claim 1, wherein the pixel cell comprises a thin film transistor arranged in an junction of the data line and the scanning line and a passivating layer arranged between the ITO thin film and the metallic layer, the metallic layer comprises a source metallic layer and a drain metallic layer of the thin film transistor, the through hole passes through the passivating layer to expose the source or the drain metallic layer, and the ITO thin film is disposed above the source or drain metallic layer of the thin film transistor by the through hole.

4. The array substrate as claimed in claim 3, wherein the slit is arranged corresponding to an edge of the source or drain metallic layer, and the slit extends along a direction farther away from the through hole.

5. The array substrate as claimed in claim 1, wherein the through hole passes through the insulation layer and the passivating layer to expose the common-electrode metallic layer, and the ITO thin film is arranged above the common-electrode metallic layer via the through hole.

6. The array substrate as claimed in claim 5, wherein the slit extends along the direction farther away from the through hole.

7. A display panel, comprising:
   a color filtering substrate, and an array substrate opposite to the color filtering substrate, the array substrate comprises at least one data line, at least one scanning line, and a pixel cell defined by the data line and the scanning line, the pixel cell comprises an an Indium Tin Oxide (ITO) thin film and at least one metallic layer below the ITO thin film, the ITO thin film electrically connects to the metallic layer via a through hole, the metallic layer comprises a gate metallic layer and a common-electrode metallic layer, the ITO thin film comprises a slit arranged between the ITO thin film and the through hole;
   a drain metallic layer; a slot arranged in the semiconductor layer and the doped semiconductor layer; wherein the slot passes through the drain metallic layer, the doped semiconductor, and a portion of the semiconductor layer;
   wherein the pixel cell further comprises a passivating layer and an insulation layer being arranged above the common-electrode metallic layer in turn, and the common-electrode metallic layer and the gate metallic layer are arranged on the same layer; and
   wherein the slit is arranged corresponding to an edge of the common-electrode metallic layer.

8. The array substrate as claimed in claim 7, wherein a length and a width of the slit are respectively larger than 2.5 microns.

9. The display panel as claimed in claim 7, wherein the pixel cell comprises a thin film transistor arranged in an junction of the data line and the scanning line and the passivating layer arranged between the ITO thin film and the metallic layer, the metallic layer comprises a source metallic layer and a drain metallic layer of the thin film transistor, the through hole passes through the passivating layer to expose the source or the drain metallic layer, and the ITO thin film is disposed above the source or drain metallic layer of the thin film transistor by the through hole.

10. The display panel as claimed in claim 9, wherein the slit is arranged corresponding to an edge of the source or drain metallic layer, and the slit extends along a direction farther away from the through hole.

11. The display panel as claimed in claim 7, wherein the metallic layer comprises a common-electrode metallic layer, the through hole passes through the insulation layer and the passivating layer to expose the common-electrode metallic layer, and the ITO thin film is arranged above the common-electrode metallic layer via the through hole.

12. The display panel as claimed in claim 11, wherein the slit extends along the direction farther away from the through hole.

* * * * *